United States Patent [19]

Glover

[11] Patent Number: 4,777,635

[45] Date of Patent: Oct. 11, 1988

[54] REED-SOLOMON CODE ENCODER AND SYNDROME GENERATOR CIRCUIT

[75] Inventor: Neal Glover, Broomfield, Colo.

[73] Assignee: Data Systems Technology Corp., Broomfield, Colo.

[21] Appl. No.: 895,034

[22] Filed: Aug. 8, 1986

[51] Int. Cl.$^4$ .............................................. G06F 11/10
[52] U.S. Cl. ........................................ 371/40; 371/38
[58] Field of Search ................... 371/37, 38, 39, 40, 371/41

[56] References Cited

U.S. PATENT DOCUMENTS

| | | | |
|---|---|---|---|
| 4,410,989 | 10/1983 | Berlekamp | 371/40 |
| 4,413,339 | 11/1983 | Riggle | 371/38 |
| 4,562,577 | 12/1985 | Glover | 371/38 |
| 4,633,471 | 12/1986 | Perera | 371/38 |
| 4,649,540 | 3/1987 | Proebsting | 371/38 |
| 4,680,764 | 7/1987 | Suzuki | 371/38 |

Primary Examiner—Michael R. Fleming
Attorney, Agent, or Firm—James R. Young

[57] ABSTRACT

Disclosed is a serial encoder and time domain syndrome generator circuit utilized in a Reed-Solomon code application where the code has been defined with the conventional or standard representation of a finite field. The encoder will process k bits of an m-bit symbol per clock cycle, where $1 \leq k \leq m$ and k evenly divides m. The encoder will process data in an interleave mode wherein data symbols of multiple codewords are interleaved in an interleaved data block. The encoder allows pipeline processing of register data within the encoder and time domain syndrome generator circuit to minimize circuit delay, and a linear network within the encoder is reduced in complexity by selecting a self-reciprocal code generator polynomial.

8 Claims, 10 Drawing Sheets

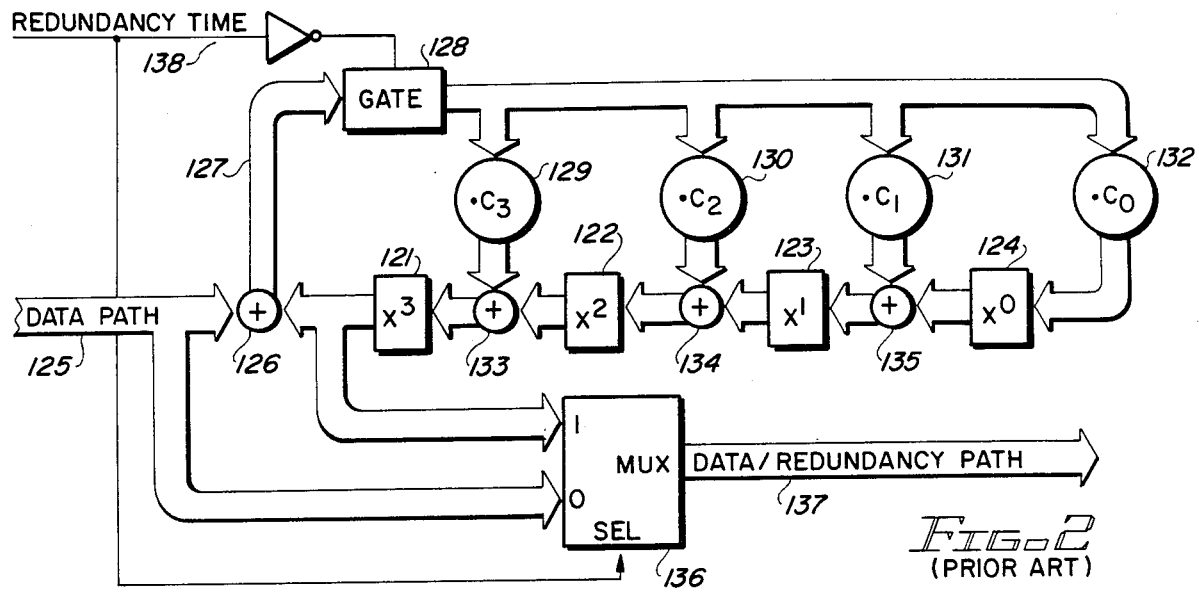
FIG-2 (PRIOR ART)
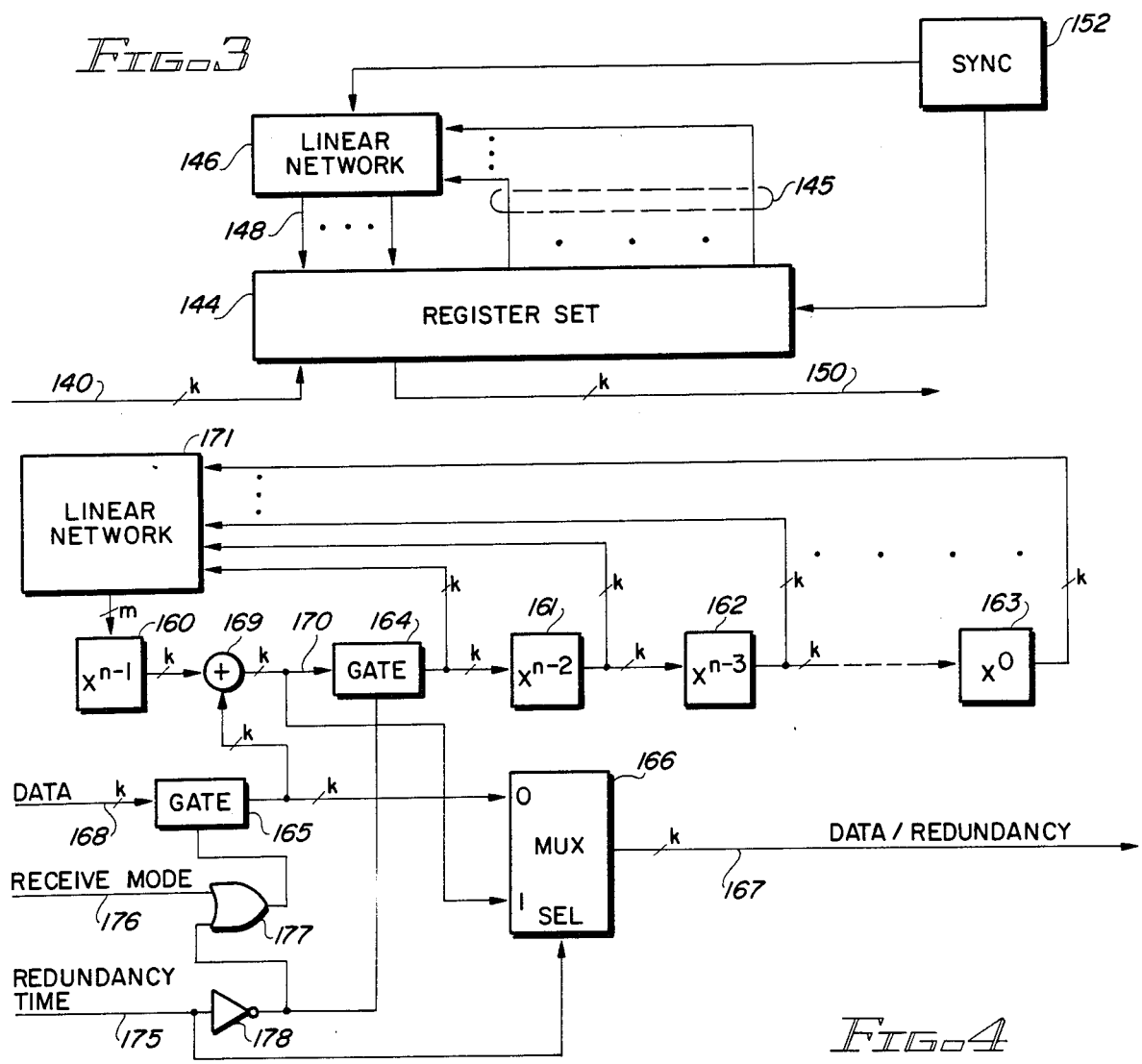
FIG-3
FIG-4

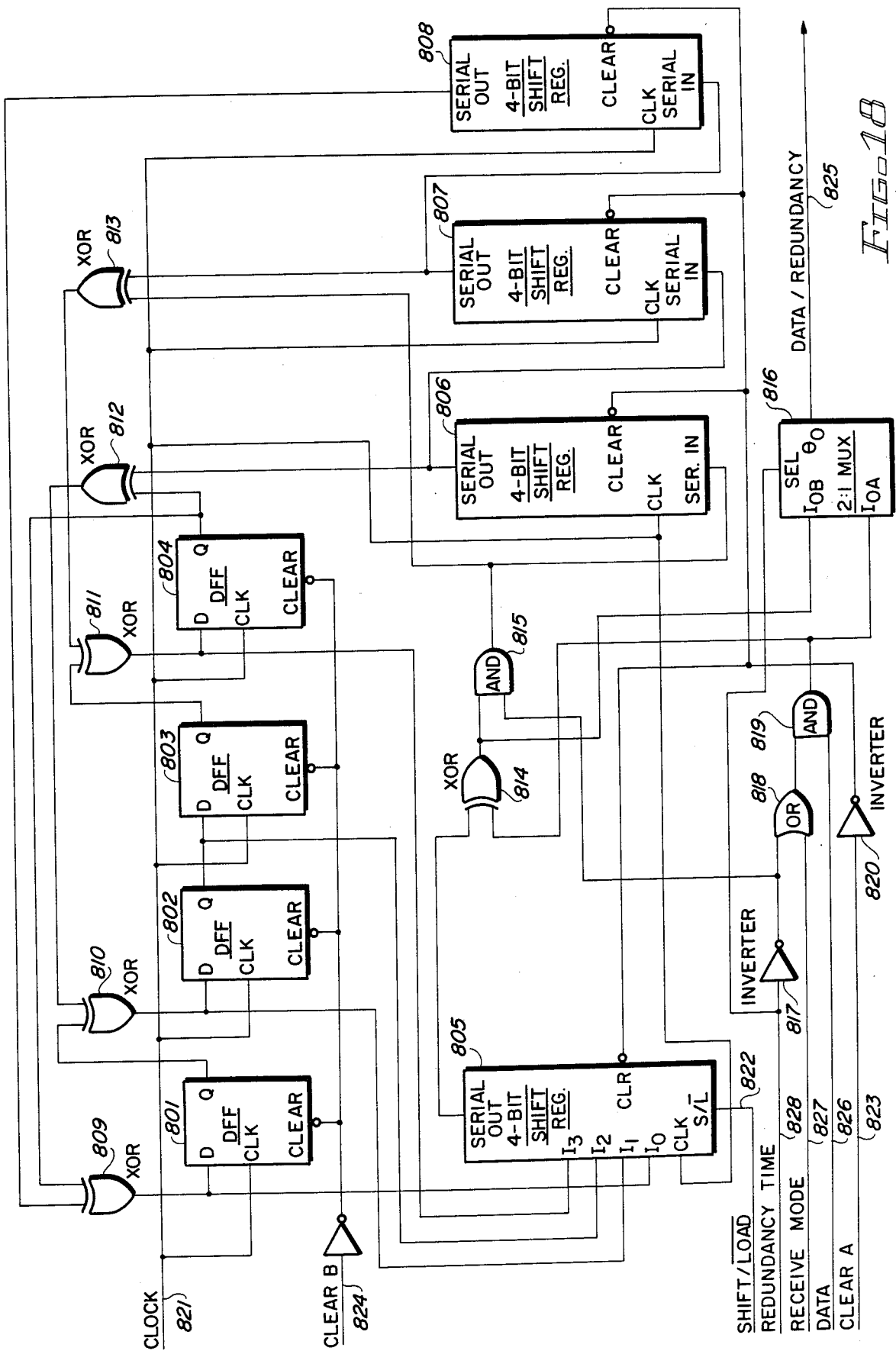

REED-SOLOMON CODE ENCODER AND SYNDROME GENERATOR CIRCUIT

BACKGROUND OF THE INVENTION

This invention relates to information storage and retrieval systems, and more particularly to means for encoding and decoding codewords for use in error detection and correction in such information storage and retrieval systems.

Digital information storage devices, such as magnetic disk, magnetic tape or optical disk, store information in the form of binary bits. Also, information transmitted between two digital devices, such as computers, is transmitted in the form of binary bits. During transfer of data between devices, or during transfer between the magnetic or optical media and the control portions of a device, errors sometimes occur. Errors can also be caused by defects in the magnetic or optical storage medium. These errors must be corrected if the storage device is to be useful.

Correction of this information is accomplished by deriving additional bits of information, called check bits or redundancy, by processing the data mathematically; appending the check bits to the original data bits during the storage process; and reprocessing the data and check bits mathematically to detect and correct erroneous data bits at the time the information is retrieved. The process of deriving the check bits is called encoding and one class of codes often used in the process of encoding is Reed-Solomon codes.

Encoding of error correction information is accomplished by processing a set of n data bits, called a data block, to devise a set of r check bits, in accord with an encoding rule such as one of the Reed-Solomon codes. An encoder processes the data bock with the encoding rule to create the r check bits and then appends the check bits to the data block to form a codeword which is transmitted over the signal channel or stored in an information storage device. When the codeword is received from the signal channel or read from the storage device, a decoder processes the codeword to detect the presence of error(s) and to correct any error(s) present before transferring the data bits for further processing.

Symbol-serial encoders for Reed-Solomon error correcting codes are known in the prior art (see Riggle, U.S. Pat. No. 4,413,339). These encoders utilize the conventional or standard finite field basis but are not easy to adapt to bit-serial operation. Bit-serial encoders for Reed-Solomon codes are also known in the prior art (see Berlekamp, U.S. Pat. No. 4,410,989), however, such encoders are based on the finite field dual basis representation. Because these bit-serial encoders use the dual basis representation, mapping circuitry is required when they are utilized in a Reed-Solomon code application where the code has been defined with the conventional or standard representation of a finite field.

It is thus apparent that there is a need in the art for an encoding system that uses the conventional or standard basis, and which is suitable for bit-serial operation within an information storage device.

BRIEF SUMMARY OF THE INVENTION

It is an object of the instant invention to provide an encoder and time domain syndrome generator circuit which derives check bits or redundancy from a data block in accordance with a Reed-Solomon code.

It is a further object of the present invention to produce such redundancy where all operations are defined over a finite field $GF(2^m)$ represented in the conventional or standard basis.

A further object of the present invention is to provide an encoder circuit wherein data may be interleaved with the degree of interleaving being programmable.

Another object of the instant invention is to provide an encoder circuit wherein the selected generator polynomial is a self-reciprocal polynomial.

Another object of the present invention is to provide pipeline processing of the shift register data within the encoder to minimize circuit delay.

Still another object of the instant invention is to allow processing of one or more symbol bits per clock cycle, up to the total number of bits in a symbol, provided the number of bits processed per clock cycle evenly divides the number of bits in a symbol.

The above and other objects of the instant invention are realized with an encoder and time domain syndrome generator circuit containing a register set that includes a first register having its output connected to one input of a summing circuit. The other input to the summing circuit is the input data stream which will be encoded. The output of the summing circuit is connected to transfer data through a multiplexer to the information channel and also connected through a gating means to the input of a second register within such register set which is connected in series to a plurality of additional registers within such register set. The outputs of the registers are connected to a linear network which produces the modulo-two sum of the products of the register outputs and coefficients of a selected code generator polynomial. This sum is transferred, in parallel, to the first register once for each m-bit data symbol.

As another feature of the present invention, the registers may be comprised of one or more random access memory (RAM) arrays.

As a further feature of the instant invention, the registers may consist of multiple register elements, each holding the number of bits contained in a symbol. This feature allows interleaving of symbols from different codewords to form an interleaved encoded data block.

In accordance with another feature of the invention, the linear network of the encoder is reduced in complexity by selecting the code generator polynomial to be self-reciprocal.

A further feature of the instant invention is to allow processing of multiple bits of a symbol (k bits) on each clock cycle, provided k evenly divides m, the number of bits in a symbol This is accomplished in the instant invention by having each register be comprised of a shift register which is k bits wide and m/k bits long.

Another feature of the instant invention allows pipeline processing of the shift register data to minimize circuit delay by accomplishing some of the modulo-two summing functions of the linear network on the m-q bit of shift register elements, where $1<q<m$, and storing this partial result for q clock cycles.

In summary, the encoder and time domain syndrome generator circuit of the instant invention creates check bits from a data block in accordance with a Reed-Solomon code utilizing the conventional representation of a finite field. It allows the use of multiple register elements for interleaving, it allows the use of RAM in place of registers, and it will process one to m bits of a symbol per clock cycle.

BRIEF DESCRIPTION OF THE DRAWINGS

The above and other objects, features, and advantages of the instant invention will be more apparent from the following more particular description thereof presented in conjunction with the following drawings, wherein:

FIG. 2 shows the classical form of a Reed-Solomon encoder;

FIG. 3 is a block diagram of the preferred embodiment of the instant invention;

FIG. 4 shows a more detailed block diagram of the instant invention showing the general case of m-bit data symbols processed k bits per clock cycle;

FIG. 18 is a schematic diagram of the circuit of FIG. 10.

DESCRIPTION OF THE PREFERRED EMBODIMENT

The following description is of the best presently contemplated mode of carrying out the instant invention. This description is not to be taken in a limiting sense but is made merely for the purpose of describing the general principles of the invention. The scope of the invention should be determined with reference to the appended claims.

Figure 1:
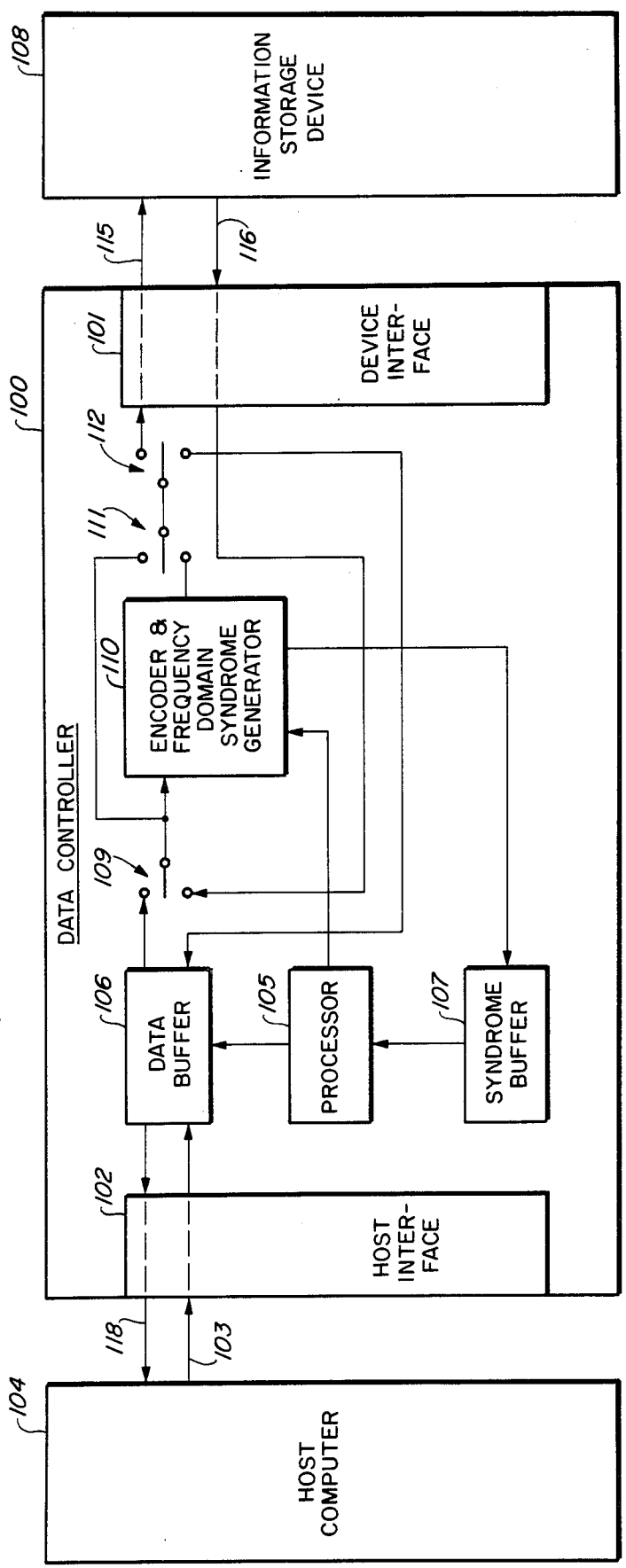
FIG. 1 shows the environment in which the instant invention is used.

Referring to FIG. 1, a data controller 100 having a host interface 102 is connected to a host computer 104. The data controller 100 also has a device interface 101 which connects the data controller 100 to an information storage device 108. In the process of writing data onto the storage device 108, data bits from the host computer 104 are transferred to the data controller 100 through an information channel 103, through the host interface 102 into a data buffer 106. Data bits are then transferred through a switch 109 into an encoder and time domain syndrome generator circuit 110 where the check bits are created. At the same time the data bits are transferred into the encoder circuit 110, they are transferred in parallel through switch 111, through switch 112, through device interface 101, and through device information channel 115, to the information storage device 108. After the data bits are transferred as described above, switch 111 is changed and the check bits are transferred from the encoder 110, through switch 111, through switch 112, through device interface 101, through device information channel 115, and written on information storage device 108.

For reading data from information storage device 108, the process is reversed. Data bits from information storage device 108 are transferred through device information channel 116, through the device interface 101, through switch 109 into the encoder 110. At the same time the data bits are being transferred into the encoder and time domain syndrome generator 110, they are transferred in parallel through switch 111, and through switch 112 into the data buffer 106. As check bits are transferred into the encoder 110, time domain syndrome bits are generated by the encoder and time domain syndrome generator 110 and transferred to the syndrome status buffer 107. After the data bits have been transferred into the data buffer 106, and syndrome and status bits transferred to the syndrome status buffer 107, the processor 105 uses the syndrome bits from the syndrome status buffer 107 to detect and correct, if necessary, errors in the data bits in data buffer 106. After correction of any errors in the data buffer 106, the data bits are transferred through the host interface 102, through the information channel 118 to the host computer 104.

FIG. 2 shows the prior art classical example of a Reed-Solomon shift register encoder circuit that implements the code generator polynomial $$x^4 + c_3 x^3 + c_2 x^2 + c_1 x + c_0$$

over the finite field $GF(2^m)$. The elements 121, 122, 123, and 124 of the circuit are m-bit wide, one-bit long registers. Data bits grouped into symbols being received on data path 125 are elements of the finite field $GF(2^m)$. Prior to transmitting or receiving, register stages 121, 122, 123, 124 are initialized to some appropriate starting value, for example zero; symbol-wide logic gate 128 is enabled; and multiplexer 136 is set to connect data path 125 to data/redundancy path 137. On transmit, data symbols from data path 125 are modulo-two summed by symbol-wide EXCLUSIVE-OR gate 126 with the high order register stage 121 to produce a feedback symbol on data path 127. The feedback symbol on data path 127 then passes through symbol-wide logic gate 128 and is applied to finite field constant multipliers 129, 130, 131, and 132. These constant multipliers multiply the feedback symbol by each of the coefficients of the code generator polynomial. The outputs of the multipliers 129, 130, and 131, are applied to symbol-wide summing circuits 133, 134, and 135 between registers 121, 122, 123, and 124. The output of multiplier 132 is applied to the low order register 124.

When the circuit is clocked, register 121, 122, and 123 take the values at the outputs of the modulo-two summing circuits 133, 134, and 135, respectively. Register 124 takes the value at the output of constant multiplier 132. The operation described above for the first data symbol continues for each data symbol through the last data symbol. After the last data symbol is clocked, the REDUNDANCY TIME signal 138 is asserted, symbol-wide logic gate 128 is disabled, and symbol-wide multiplexer 136 is set to connect the output of the high order register 121 to the data/redundancy path 137. The circuit receives 4 additional clocks to shift the check bytes to the data/redundancy path 137. The result of the operation described above is to divide an information polynomial I(x) by the code generator polynomial G(x) to generate a redundancy polynomial R(x) and to append the redundancy polynomial to the information polynomial to obtain a codeword polynomial C(x). Circuit operation can be described mathematically as follows:

$$R(x) = (x^4 * I(x)) \bmod G(x)$$

$$C(x) = x^4 * I(x) + R(x)$$

where + means modulo-two sum and * means finite field multiplication.

FIG. 3 shows a block diagram of the instant invention. Input data bits and check bits enter the encoder circuit on a data path 140 which is k bits wide, where $1 < k < m$ and m is the number of bits in a symbol. The data bits pass into a register set 144. Outputs of the register set 144 are fed to a linear network 146 via a data path 145 which has one signal path for each coefficient of a selected code generator polynomial (not shown). Parallel output of the linear network 146 is transferred to the register set 144 over a data path 148 which is m bits wide. Output data from the register set 144 is transferred to an information channel over data path 150, which is k bits wide. Operation of the system is controlled by a synchronization circuit 152.

FIG. 4 is a more detailed block diagram of the general case of the instant invention. Shown is an encoder and time domain syndrome generation circuit which operates on m-bit symbols from GF($2^m$), k bits per clock cycle where k evenly divides m. The classical Reed-Solomon encoder circuit of the prior art utilizes the conventional representation of a finite field and operates on m-bit symbols from GF($2^m$) but is not easily adaptable to bitserial operation. The bit-serial encoders of the prior art use the dual basis representation and require mapping circuitry when utilized in an application where the conventional representation of a finite field is utilized by the transmission medium. The circuit of the instant invention, FIG. 4, employs the conventional finite field representation and performs the same function as the classical encoder except that it is easily adapted to operate on k bits of an m-bit symbol per clock, where k evenly divides m.

The circuit of FIG. 4 utilizes n registers, here represented by 160, 161, 162, and 163, where n is the degree of the code generator polynomial. The input and output paths of each register are k bits wide. The depth (number of delay elements between input and output) of each register is m/k. When k is less than m, each of the registers 160, 161, 162, and 163 function as k independent shift registers, each m/k bits long. Prior to transmitting or receiving, all registers 160, 161, 162, and 163 are initialized to some appropriate starting value, for example zero; logic gates 164 and 165 are enabled; and multiplexer 166 is set to pass data from logic gate(s) 165 to data/redundancy path 167. Any starting value for registers 160, 161, 162 and 163 could be used; the appropriate starting value is selected based on circuit considerations beyond the scope of the present invention. A starting value of all one bits could be used, for example, to ensure that the check bits would not be zero for a data block of all zeros. On transmit, data symbols from data path 168 are modulo-two summed by EXCLUSIVE-OR gate(s) 169 with the output of the high order register 160, k bits at a time, to produce a feedback signal at 170. The feedback signal is passed through gate(s) 164 to the linear network 171 and to the next to highest order register 161. The output of register 161 is fed to the next lower order register 162 and so on. The output of all registers other than the highest order register 160 also have outputs that go directly to the linear network 171. Once per m-bit data symbol the output of linear network 171 is transferred, in parallel, to the high order register 160.

When k is equal to m, the linear network 171 is comprised only of EXCLUSIVE-OR gates. When k is not equal to m, the linear network 171 also includes linear sequential logic components. On each clock cycle, each register is shifted to the right one position and the leftmost positions of each register take the values at their inputs. The highest order register 160 receives a new parallel-loaded value from the linear network 171 once per m-bit data symbol. Operation continues as described until the last data symbol on data path 168 has been completely clocked into the circuit. Then the REDUNDANCY TIME signal 175 is asserted, which disables gates 174 and 165 (because of INVERTER circuit 178) and changes multiplexer 166 to pass the check symbols (k bits per clock) from the output of the modulo-two summing circuit 169 to the data/redundancy path 167. Clocking of the circuit continues until all redundancy symbols have been transferred to the data/redundancy path 167. The result of the operation described above is the same as that of the classical Reed-Solomon encoder shown in FIG. 2., given identical stimulus (data symbols). That is, the information polynomial I(x) is divided by the code generator polynomial G(x) to generate a redundancy polynomial R(x) which is appended to the information polynomial I(x) to obtain the codeword polynomial C(x). Operation can be described mathematically as follows:

$$R(x) = (x^{m} * I(x)) \bmod G(x)$$

$$C(x) = x^{m} * I(x) + R(x)$$

In receive mode, the circuit of FIG. 4 operates as for a transmit operation except that after all data symbols have been clocked into the circuit, RECEIVE MODE signal 176, through OR gate 177, keeps gate(s) 165 enabled while REDUNDANCY TIME signal 175 disables gate(s) 164 and changes multiplexer 166 to pass time domain syndromes from the output of modulo-two summing circuit 169 to the data-redundancy path 167.

The circuit can be viewed as generating transmit redundancy (check bits) during transmit, and receive redundancy during receive. Then the time domain syndromes can be viewed as the modulo-two difference between transmit redundancy and receive redundancy. The time domain syndromes are decoded to obtain error locations and values which are used to correct data. Random access memory (RAM) could be used as a substitute for registers 160, 161, 152, and 163.

Figure 5:
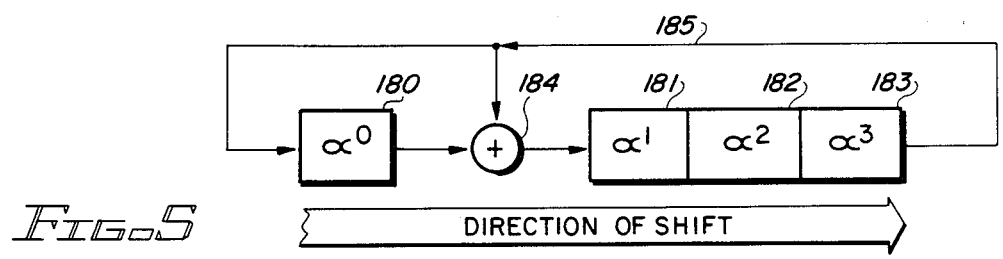
FIG. 5 is a circuit whose states generate the finite field elements of GF(16) in conventional basis representation.

FIG. 5 is a drawing of a bit-serial shift register that generates all of the non-zero elements of GF(16) based on the primitive finite field generator polynomial $$x^4 + x + 1$$

over GF(2). The circuit is comprised of four single bit memory elements 180, 181, 182, and 183 and a modulo-two summing circuit 184. Data path 185 is the feedback path. When the circuit is clocked, each memory element takes on the value at its input. If the memory element 180 is initialized to one, memory elements 181, 182, 183 are initialized to zero, and the circuit is clocked 14 times the circuit will have generated all 15 non-zero elements of GF(16). A list of the field elements so generated is as follows:

TABLE 1

|            | $\alpha^0$ | $\alpha^1$ | $\alpha^2$ | $\alpha^3$ |
|------------|---|---|---|---|
|            | 0 | 0 | 0 | 0 |
| $\alpha^0$ | 1 | 0 | 0 | 0 |
| $\alpha^1$ | 0 | 1 | 0 | 0 |
| $\alpha^2$ | 0 | 0 | 1 | 0 |
| $\alpha^3$ | 0 | 0 | 0 | 1 |
| $\alpha^4$ | 1 | 1 | 0 | 0 |
| $\alpha^5$ | 0 | 1 | 1 | 0 |
| $\alpha^6$ | 0 | 0 | 1 | 1 |
| $\alpha^7$ | 1 | 1 | 0 | 1 |
| $\alpha^8$ | 1 | 0 | 1 | 0 |
| $\alpha^9$ | 0 | 1 | 0 | 1 |
| $\alpha^{10}$ | 1 | 1 | 1 | 0 |
| $\alpha^{11}$ | 0 | 1 | 1 | 1 |
| $\alpha^{12}$ | 1 | 1 | 1 | 1 |
| $\alpha^{13}$ | 1 | 0 | 1 | 1 |
| $\alpha^{14}$ | 1 | 0 | 0 | 1 |

Figure 6:
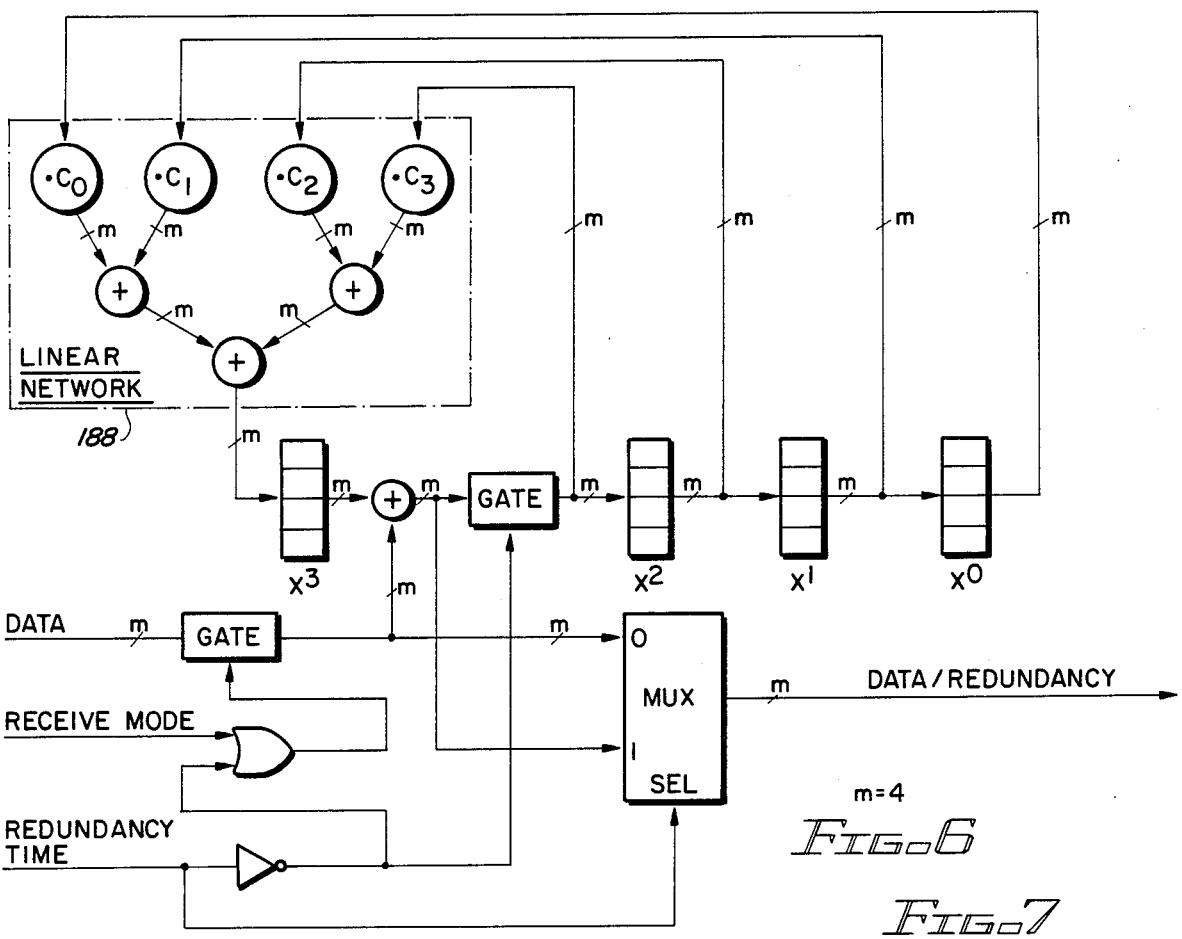
FIG. 6 shows a block diagram of this invention in the special case where k=m and m=4.

FIG. 6 shows an example of the special case of FIG. 4 where k=m and m=4. When k=m, each data symbol is processed in one clock cycle and the linear network 188 is comprised of EXCLUSIVE-OR logic gates only. For this case, the linear network 188 can be viewed as containing a finite field multiplier circuit, using combinatorial logic, for each coefficient of the code generator polynomial and modulo-two summing circuits (finite field adders) to sum the multiplier outputs. Obviously logic reduction is desirable. One way to decrease logic is to minimize the number of unique coefficients in the code generator polynomial. Even when a self-reciprocal polynomial is used, it is still possible to further minimize the number of EXCLUSIVE-OR gates or depth of EXCLUSIVE-OR gates by evaluating the logic required for each combination of field generator polynomial and each possible code generator polynomial. The code generator polynomial for a t symbol-error correcting Reed-Solomon code is defined by $$G(x) = \prod_{i=h}^{h+2t-1} (x + \alpha^{j*i})$$

where h may be selected to have any value between 0 and the field size minus one, but must have a particular value if a self-reciprocal polynomial is desired. j may be selected to minimize the linear network although in many cases code parameters establish restrictions on its value.

There was no attempt to minimize the linear network for the circuit of FIG. 6. FIG. 6 implements the encoder and time domain syndrome generation circuitry of the instant invention for the special case k=m and for the Reed-Solomon code defined by $$G(x) = \prod_{i=6}^{9} (x + \alpha^i) = x^4 + \alpha^{3*}x^3 + \alpha^{*}x^2 + \alpha^{3*}x + 1$$

Figure 7:
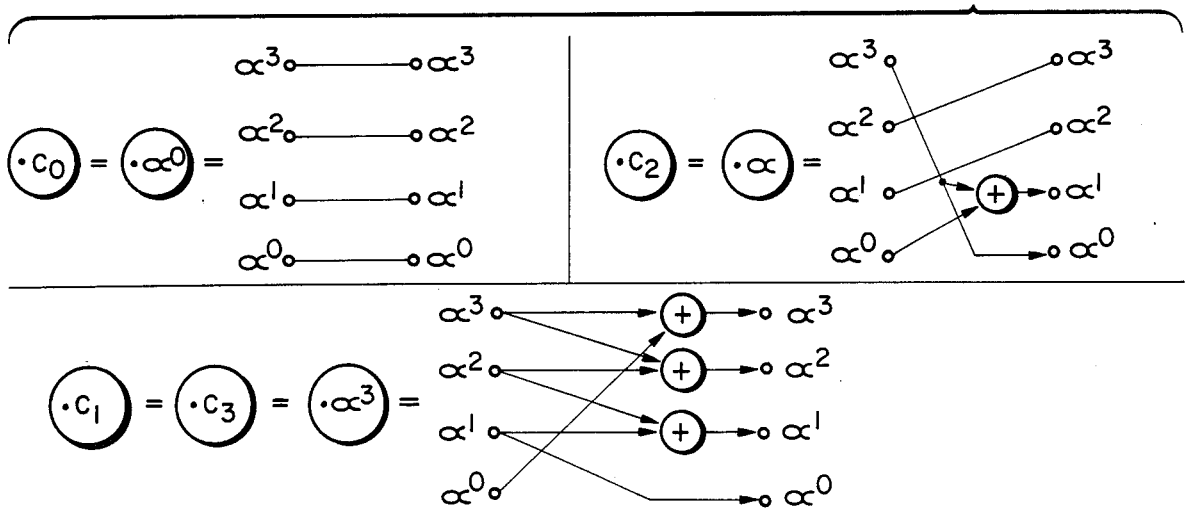
FIG. 7 shows the details for the coefficient constant multipliers of FIG. 6.

Details of the finite field multiplier circuits of the linear network 188 of FIG. 6, are shown in FIG. 7. These circuits are known in the prior art as shown on pages 110 and 111 of *Practical Error Correction Design for Engineers* by Neal Glover, Copyright 1982 (Version 1) published by Data Systems Technology, Corp., 1047 E. 9th Ave. #102, Broomfield, Colo. 80020.

Figure 8:
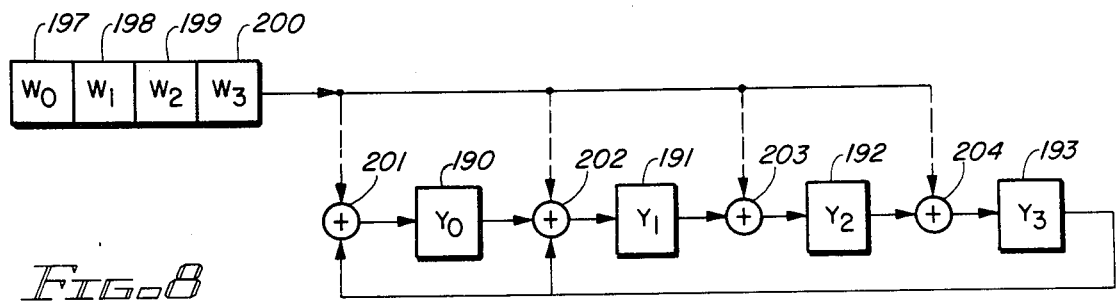
FIG. 8 shows a bit-serial finite field constant multiplier circuit.

FIG. 8 is a drawing of a bit-serial finite field multiplier circuit for GF(16). All data paths in this circuit are one bit wide. It multiples a finite field variable element w, here represented by single-bit register stages 197, 198, 199, and 200 by a constant field element to yield the product y, here represented by single-bit register stages 190, 191, 192, and 193. The multiplier constant is established by the connections from register stage 200 to the summing circuits 201, 202, 203, and 204. To multiply by a particular power of α, select the connections based on the components from the list of finite field elements shown in table 1. To multiply by $\alpha^0$, for example, make the connection from register stage 200 to the modulo-two summing circuit 201. To multiply by $\alpha^4$, for example, recognize from the list of finite field elements shown in table 1 that $\alpha^4$ is equal to $\alpha^1 + \alpha^0$ and therefore make connections from register stage 200 to the modulo-two summing circuits 201 and 202. such circuits are known in the art as shown on page 112 of *Practical Error Correction Design For Engineers* cited above.

Figure 9:
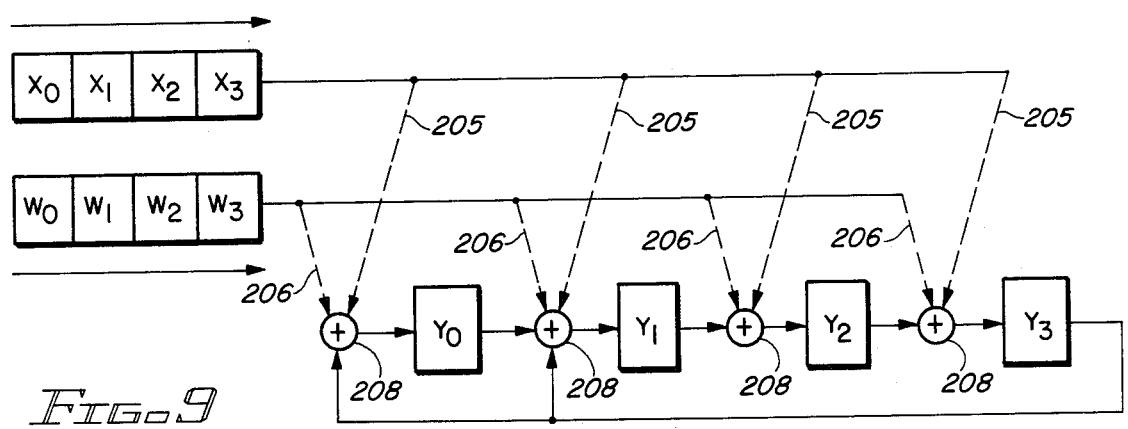
FIG. 9 shows a bit-serial circuit to form the sum of finite field products of two variable field elements and two constant field elements.

Similar circuits can be used to sum the products of multiple variable field elements and constant field elements, as shown in FIG. 9 and on page 112 of the reference cited above. Note that each of the summing circuits 208 is a parity tree with one output and one to four inputs, depending on the constant multipliers implemented. The circuit computes the sum of the product of a first variable field element in the x register and a first constant field element established by the connections 205, and the product of a second variable field element in the w register and a second constant field element established by connections 206.

Figure 10:
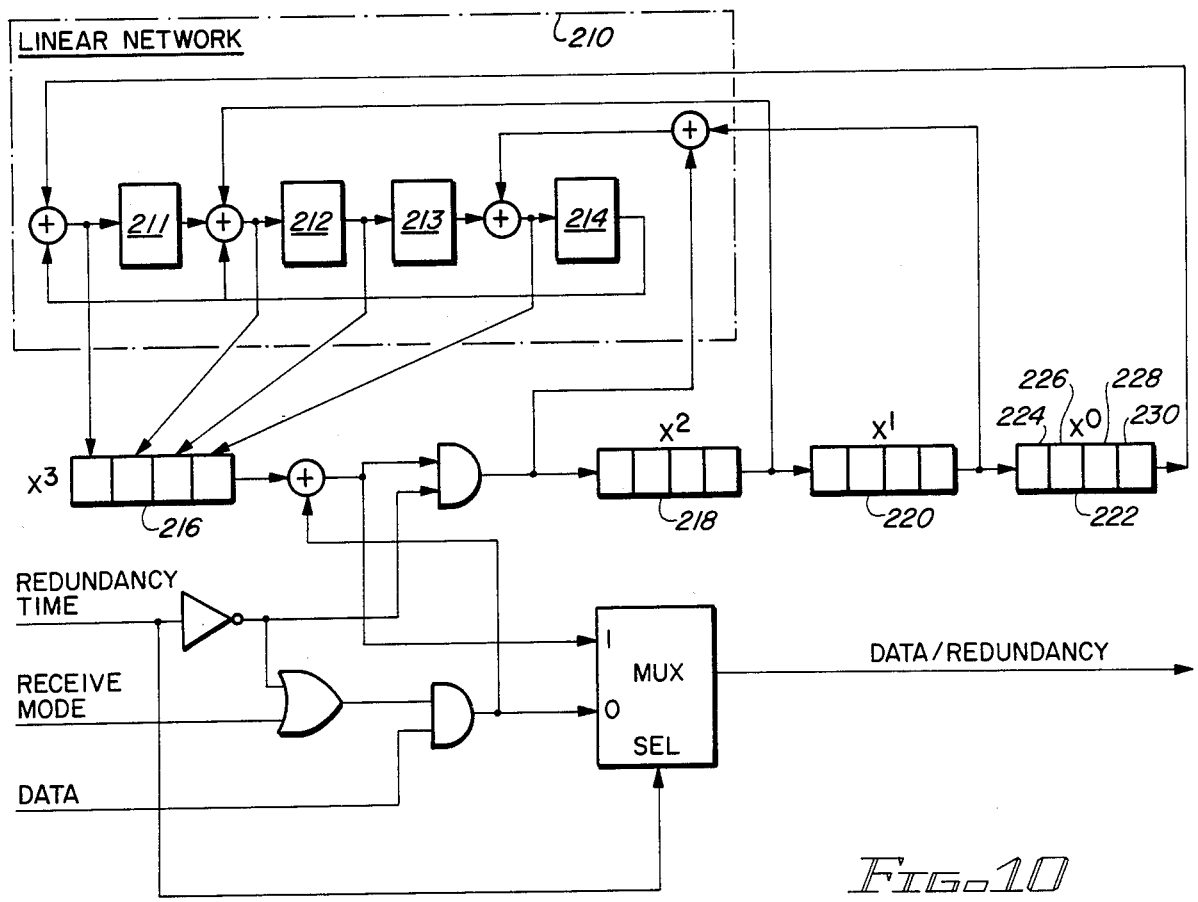
FIG. 10 is a detailed block diagram of this invention showing the special, bit serial, case where k=1 and m=4.

FIG. 10 shows an example of the special where case k=1 (the bit-serial case) of the instant invention for the Reed-Solomon code defined by $$G(x) = \prod_{i=6}^{9} (x + \alpha^i) = x^4 + \alpha^{3*}x^3 + \alpha^{*}x^2 + \alpha^{3*}x + 1$$

The general case, FIG. 4, and the special case where k=m, FIG. 6, have already been discussed. For this case where k=1, the linear network 210 is a bit-serial finite field constant multiplier which sums the products of several variable field elements and constant field elements (an extension of the circuit of FIG. 9). For the circuit of FIG. 10, the liner network 210 evaluates the finite field expression $$\alpha^3 * R_3 + \alpha * R_2 + \alpha^3 * R_1 + R_0$$

The result of the above expression is generated and stored in register elements 211, 212, 213, and 214, equivalent to 190A, 191A, 192A, and 193A of FIG. 9. Each of the registers 216, 218, 220, and 222 is a shift register comprised of four one-bit register stages, as exemplified by stages 224, 226, 228, and 230 of register 222. The four stages of the registers 216, 218, 220, and 222 are clocked four times for a data symbol. On the last clock, the output of the linear network 210 is gated to register 216. The circuit of FIG. 10 requires fewer logic gates than the circuit of FIG. 6 but requires 4 clock times to accomplish what the circuit of FIG. 6 accomplishes in 1 clock time.

Figure 11:
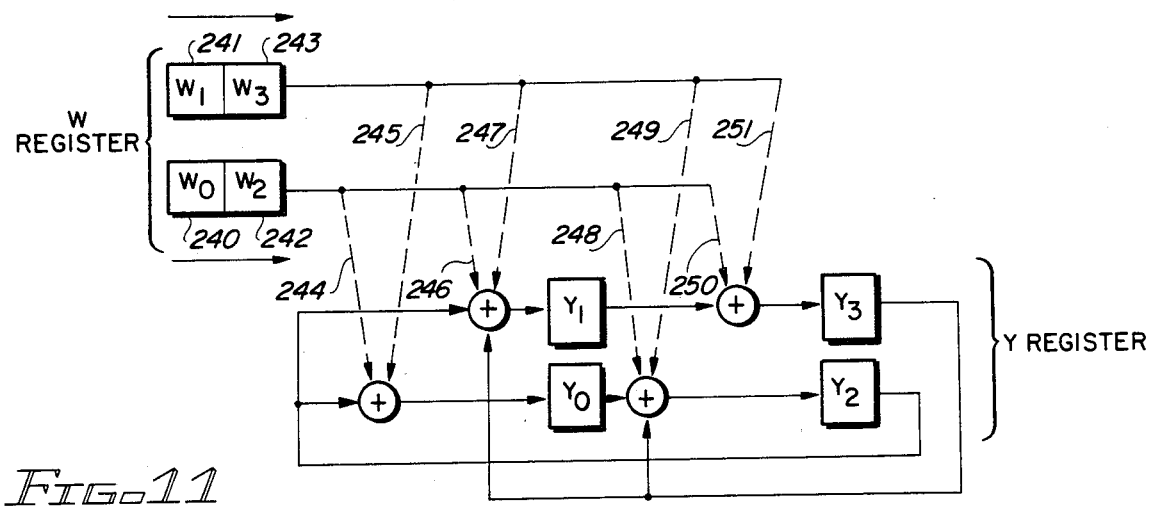
FIG. 11 shows a two-bit-serial finite field constant multiplier circuit.

FIG. 11 shows a 2-bit-serial multiplier circuit that generates the product of a variable field element (shown by register stages 240, 241, 242, and 243) and a constant field element (defined by the set of possible connections 244, 245, 246, 247, 248, 249, 250, or 251 in two clock times, with the general case using m/2. The connections 244, 246, 248, and 250 are established by the contents of Table 1 for the particular multiplier constant selected. The connections 245, 247, 249, and 251 are established by the contents of Table 1 for the particular multiplier constant selected, time $\alpha$.

Figure 12:
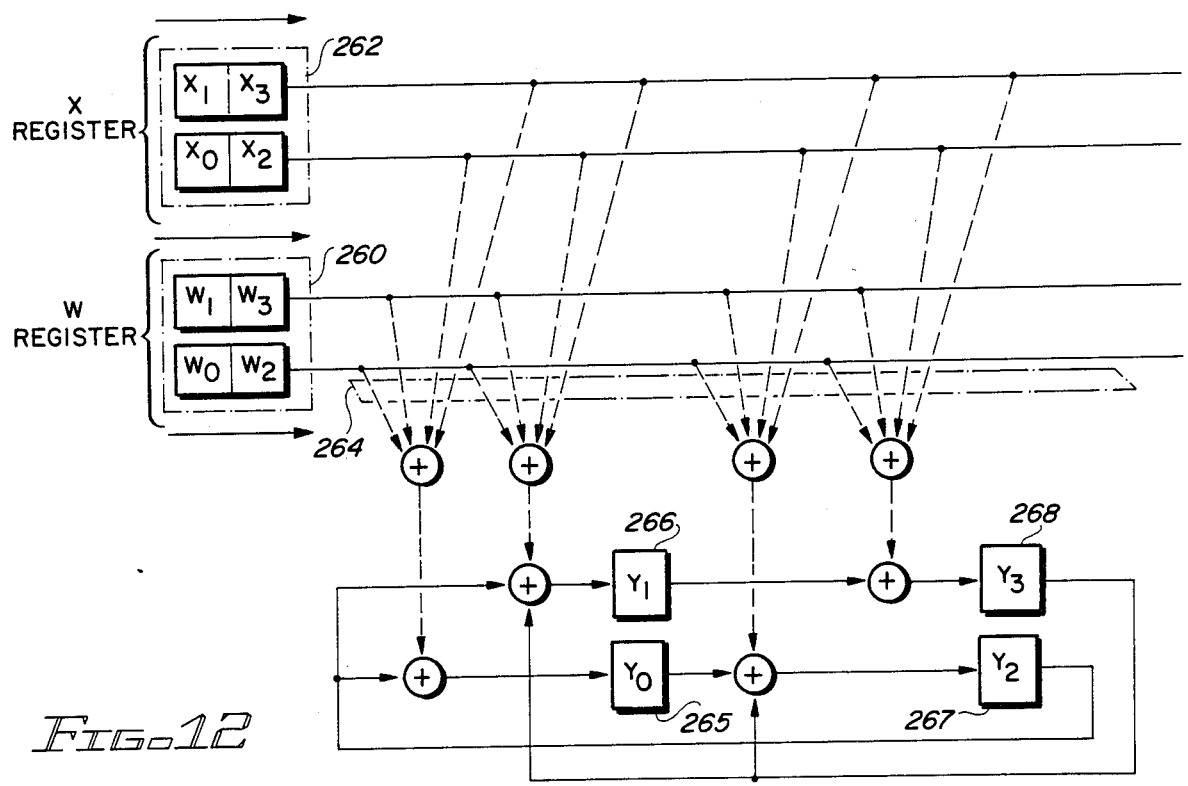
FIG. 12 shows a two-bit-serial circuit to form the sum of finite field products of two variable field elements and two constant field elements.

FIG. 12 shows an example of a similar circuit which can be used to sum the products of two variable field elements and constant field elements in m/2 clock times. Two variable field elements 260 and 262 are multiplied by two constant field elements defined by connections 264. The result is placed in register elements 265, 266, 267, and 268.

Figure 13:
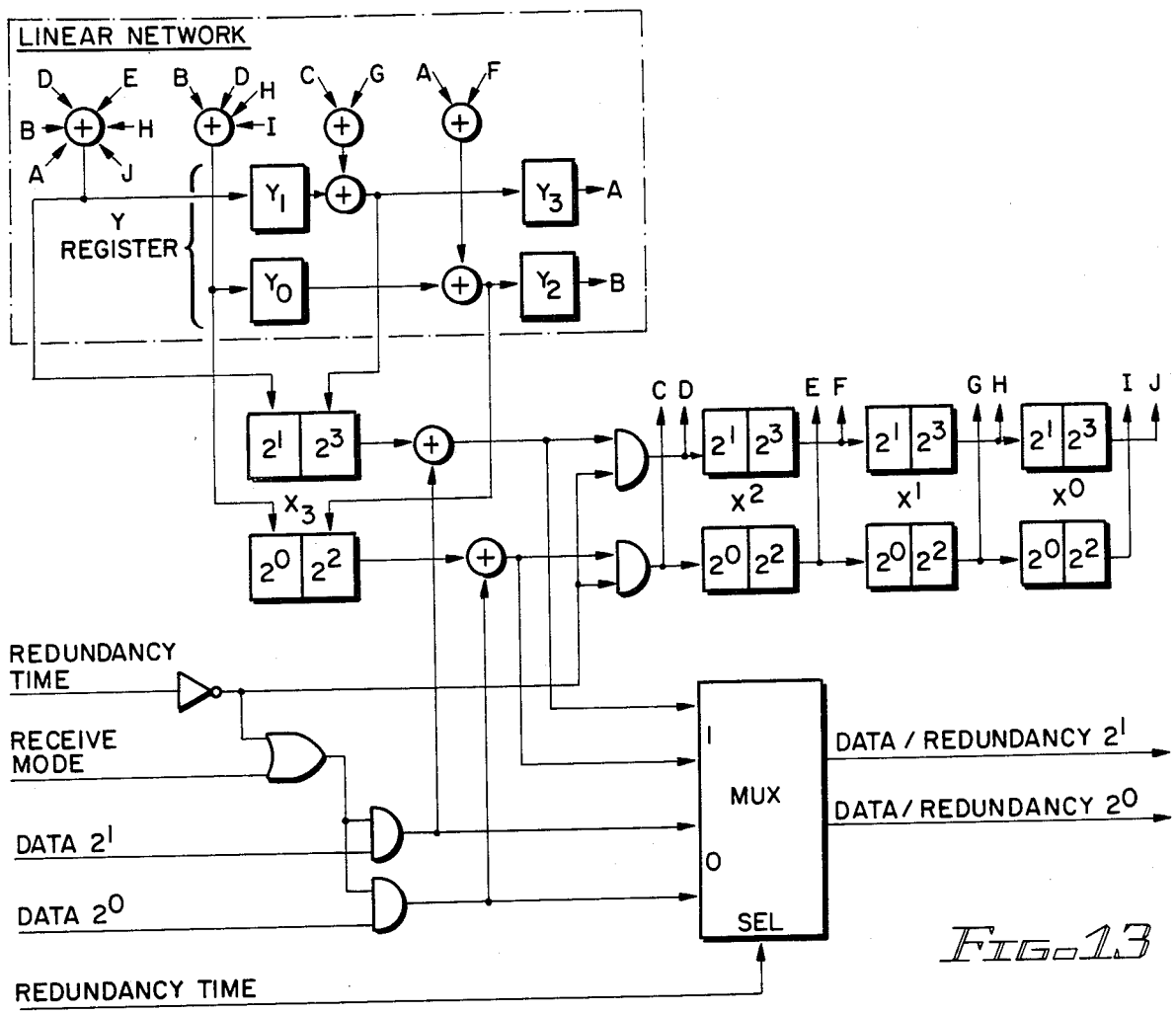
FIG. 13 is a block diagram of this invention showing the special, 2-bit serial, case where k=2 and m=4.

FIG. 13 shows a detailed block diagram of the special case k=2 (the 2-bit-serial case) of the instant invention for the Reed-Solomon code defined by $$G(x) = \prod_{i=6}^{9} (x + \alpha^i) = x^4 + \alpha^3 * x^3 + \alpha * x^2 + \alpha^3 * x + 1$$

This circuit utilizes for its linear network a 2-bit-serial multiplier similar to the circuit of FIG. 12 with 4 input variables.

Figure 14:
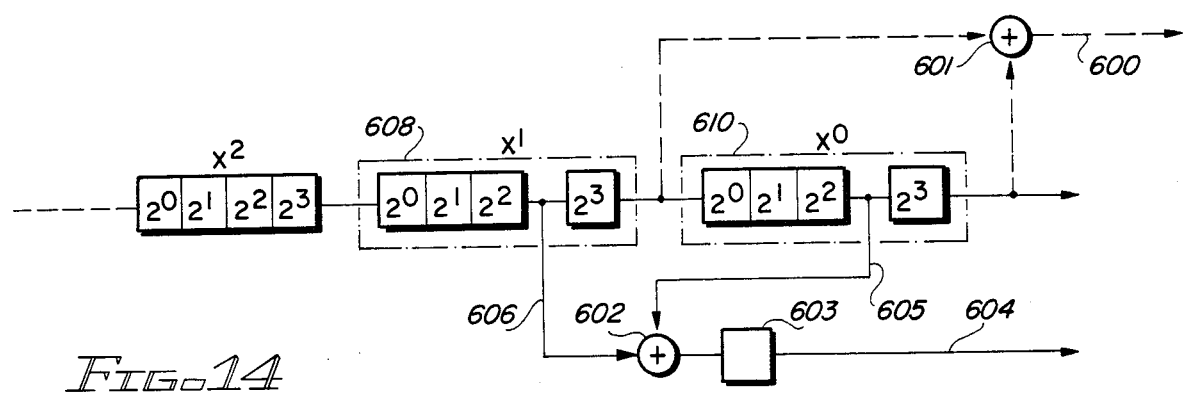
FIG. 14 is an example of using pipeline processing with the instant invention.

FIG. 14 shows an example of pipelining for the special case m=4 and k=1 (bit serial) of the instant invention. The dashed lines show the equivalent circuit without pipelining. Without pipelining, the signal 600 is delayed after each clock by the propagation delay time of the EXCLUSIVE-OR gate 601. With pipeline processing, shown by solid lines, inputs 605 and 606 to the EXCLUSIVE-OR gate 602 are tapped off shift registers 608 and 610 one bit time early and the output of EXCLUSIVE-OR gate 602 is delayed for one bit time by the single bit memory element (latch) 603. With pipelining, the delay between the circuit being clocked and signal 604 becoming valid is less than without pipelining, since the delay of the EXCLUSIVE-OR gate 602 does not directly affect signal 604 as EXCLUSIVE-OR gate 601 affected signal 600 without pipelining.

Figure 15:
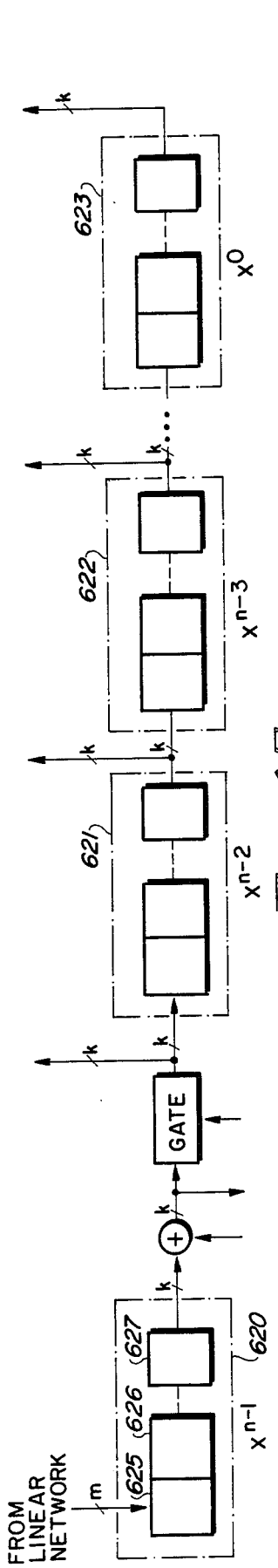
FIG. 15 shows the register set of this invention with interleaving for the general case.

FIG. 15 shows an example of the register set when interleaving is utilized, for the general case of the instant invention. Using i interleaves, each register 160, 161, 162, and 163 of the circuit of FIG. 4 is replaced by i register elements, each consisting of m one-bit memory elements organized as k by m/k bits. Register 160 of FIG. 4 is replaced in FIG. 15 by register element 620, which is comprised of i register elements, for example 625, 626, and 627, each of which contains m one-bit memory elements organized as k by m/k. For example if i=3, m=8, and k=2, each register 620, 621, 622, and 623 is comprised of twenty-four bits (three register elements, each containing eight one-bit memory elements), with each eight-bit register element organized as two bits wide and four bits long. Except that each register has i register elements, the circuit of FIG. 15 functions identically to the circuit of FIG. 4.

Figure 16A:
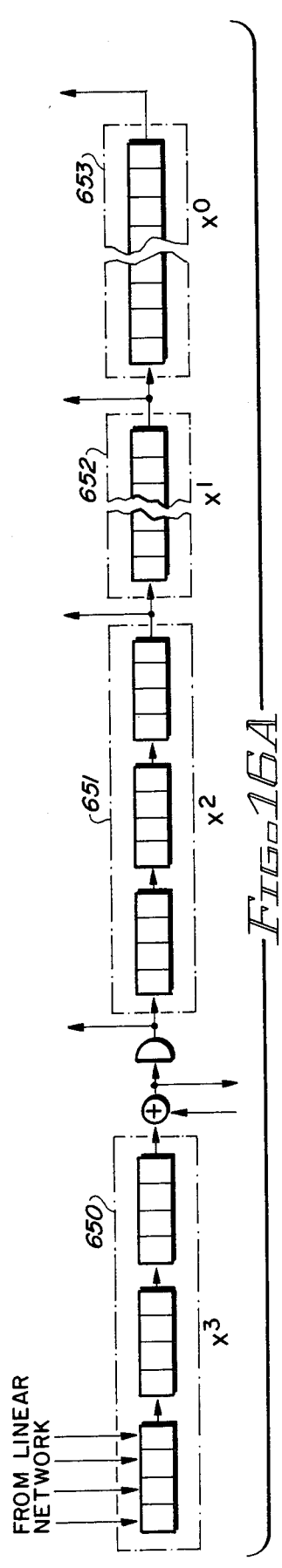
FIG. 16A shows an example of the register set of this invention with interleaving for the bit-serial case.

FIG. 16A shows an example of the register set when three-way interleaving is utilized, for the special case where m=4 and k=1 of the instant invention. This figure is similar to FIG. 10, with registers 650, 651, 652, and 653 of FIG. 16A replacing registers 216, 218, 220, and 222 of FIG. 10, respectively. Except for interleaving, the circuit of FIG. 16A functions the same as the circuit of FIG. 10.

Figure 16B:
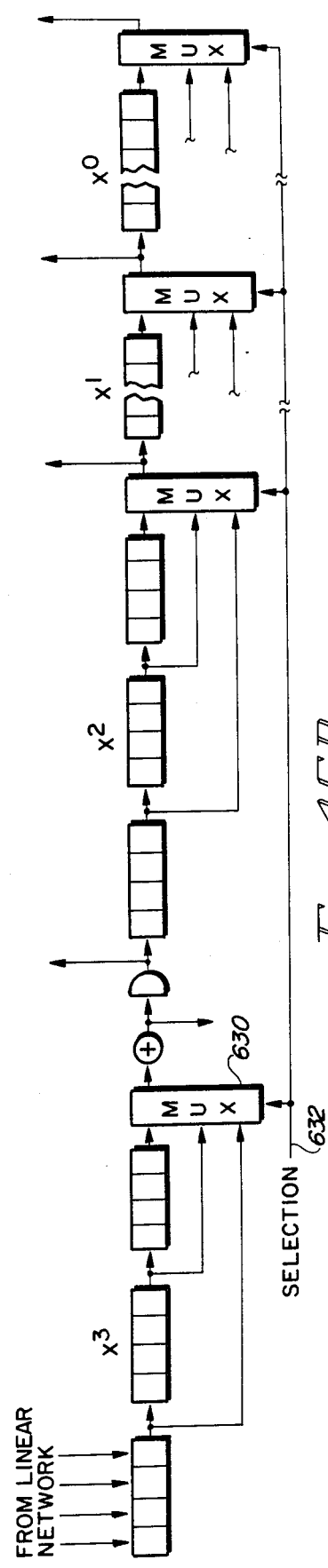
FIG. 16B shows interleaving wherein the level of interleaving is programmable.

FIG. 16B shows the circuit of FIG. 16A modified for programmability for the number of interleaves. The output of each register element is connected to a multiplexer, for example 630, and a selection signal 632 connects the appropriate register element output to the input of the following register. By programming the selection signal, the degree of interleaving is specified.

Figure 17:
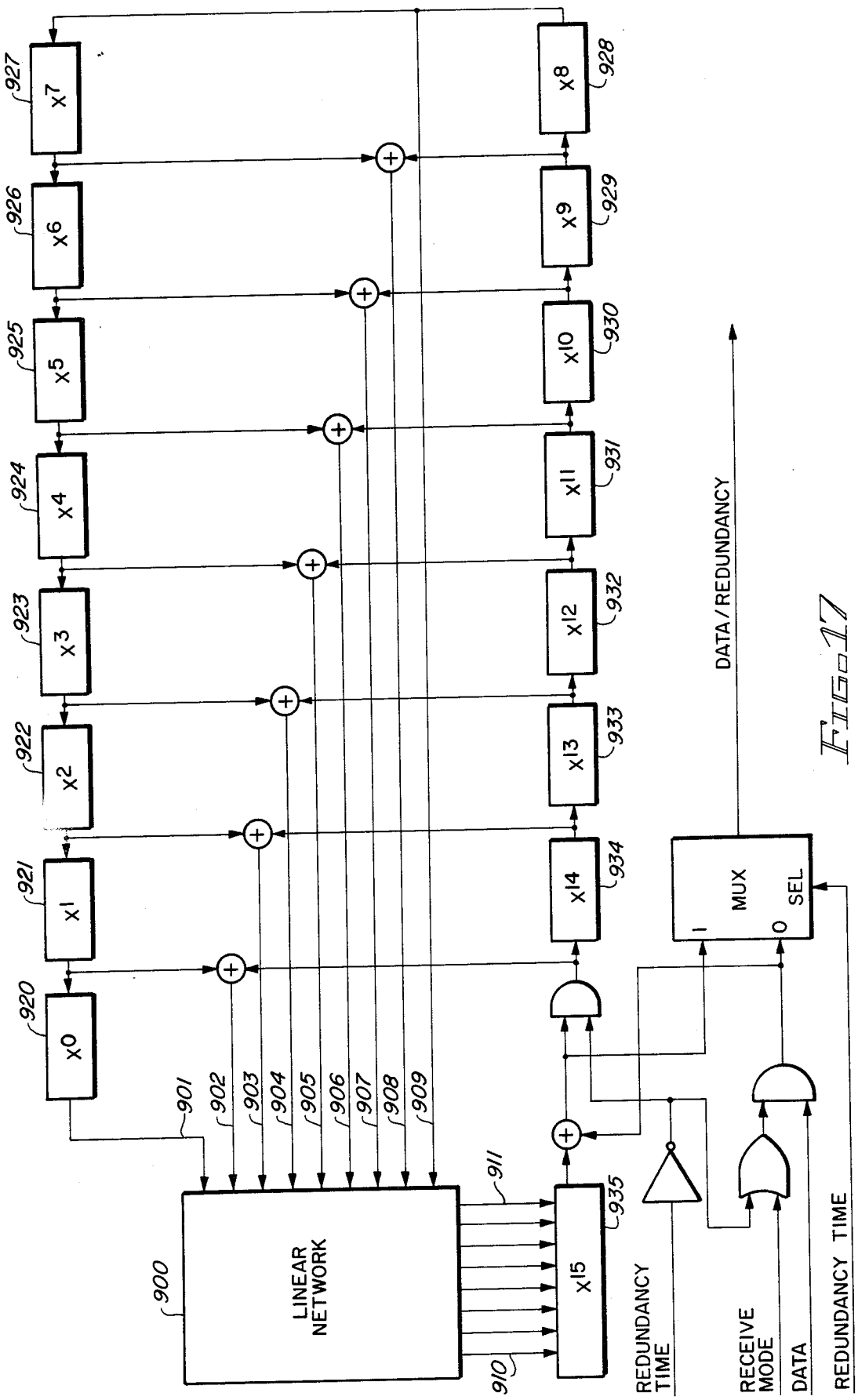
FIG. 17 shows the use of a self-reciprocal polynomial with this invention.

FIG. 17 shows an example of the circuit of the instant invention for the case k=1, m=8 wherein a self reciprocal code generator polynomial is utilized. The use of a self-reciprocal polynomial reduces the number of unique coefficients by roughly half. By EXCLUSIVE-OR-ing the outputs of stages with identical coefficients, the number of unique inputs to the linear network is reduced roughly by half.

FIG. 18 is a schematic diagram of an example of the bit serial case (k=1 and m=4) of the present invention. It implements the code and circuit of FIG. 10 in more detail. The code generator is $$x^4 + \alpha^3 * x^3 + \alpha * x^2 + \alpha^3 * x + 1$$

over the GF(16) field of Table 1. The circuit utilizes standard components which are defined below:

801, 802, 803, 804: Positive-edge clocking 'D' FLIP-FLOPS with synchronous clear
805: Positive-edge clocking 4-bit shift register with asynchronous clear and parallel synchronous load
806, 807, 808: Positive-edge clocking 4-bit shift registers with asynchronous clear
809, 810, 811, 812, 813, 814: EXCLUSIVE-OR gates
815, 819: AND gates
816: One stage of a 2:1 multiplexer
817, 820: INVERTERS
818: INCLUSIVE-OR gate The circuit receives several signals from the synchronization means. They are:
CLOCK
CLEAR A
CLEAR B
SHIFT/$\overline{\text{LOAD}}$
REDUNDANCY TIME
RECEIVE MODE The linear network of FIG. 10 is implemented in FIG. 18 by 'D' FLIP-FLOPS 801, 802, 803, and 804 and EXCLUSIVE-OR gates 809, 810, 811, 812, and 813. The shift registers 216, 218, 220, and 222 of FIG. 10 are implemented in FIG. 14 by shift register circuits 805, 806, 807, and 808. The CLOCK signal of FIG. 18, which occurs once per data symbol bit, drives the CLK input of all 'D' FLIP-FLOPS 801, 802, 803, and 804 and shift register circuits 805, 806, 807, and 808, all of which are positive-edge clocking.

The CLEAR A signal is an asynchronous clear and is used to initialize all shift register circuits 805, 806, 807, and 808 prior to transmit or receive. The CLEAR B signal is a synchronous clear and is used to synchronously clear the 'D' FLIP-FLOPS 801, 802, 803, and 804 once per data symbol. The SHIFT/$\overline{\text{LOAD}}$ signal is used to control parallel loading and shifting of the shift register 805. It goes low once per data symbol to synchronously parallel load shift register 805 from the linear network. At the end of a transmit or receive operation, the 'D' FLIP-FLOPS 801, 802, 803, and 804 are left in a clear state for the next operation.

It is well known in the art that if a Reed-Solomon encoder is provided a data block for encoding whose data symbols are all zero except for the last data symbol, which is $\alpha^0$, the data plus redundancy symbols will be equal to the coefficients of the code generator polynomial. Table 2 is a trace of the last twenty four cycles of CLOCK 821 of the codeword for operation of the circuit of FIG. 18 when provided such an input. Note that only the last two of the eleven data symbols are shown on the trace. The contents of the 'D' FLIP-FLOPS 801, 802, 803, and 804 and the shift register circuits 805, 806, 807, and 808 shown in the trace represent their new states after clocking has occurred. The states of all other signals shown on the trace represent their value during the low to high transition of clocking. The table entries under the heading 801-804 represent the Q output of 'D' FLIP-FLOPS 801, 802, 803, and 804 respectively. The table entries under 805, 806, 807, and 808 represent the four-bit contents of shift register circuits 805, 806, 807, and 808 respectively, with the leftmost bit under each entry representing the low order bit of the respective shift register circuit. The numbers under the heading 821 are sequential to represent the cycles of the CLOCK signal 821 which are shown in the trace. The headings for Table 3 and Table 4 are the same as the headings for Table 2.

The circuit of FIG. 18 also generates time domain syndromes. The trace of Table 2 also represents time domain syndrome generation for the case where the data and redundancy transmitted were all zeros but on receive the last data bit was in error. In this case, the time domain syndrome output appears on data/redundancy path 825. Likewise, the trace of Table 3 represents time domain syndrome generation for the case where the data and redundancy transmitted were all zeros but on receive the next to last data bit was in error.

Table 3 is a trace of the operation of the circuit of FIG. 18 for the last twenty four cycles of CLOCK 821 of the codeword when all data symbols prior to the last data symbol are zero and the last data symbol is $\alpha^1$. Each codeword of a Reed-Solomon code is a multiple of the code generator polynomial. For the example of Table 3, the outputted codeword is $\alpha^1*G(x)$.

It is also well known in the art that is all information symbols inputted to a Reed-Solomon encoder are identical, then all redundancy symbols will be identical and will be equal to the data symbols. All sixty cycles of CLOCK 821 for the codeword are traced for the circuit of FIG. 18 in Table 4, where the data symbol is 1100.

TABLE 2

| | | | | SIGNALS | | | | | | |
|---|---|---|---|---|---|---|---|---|---|---|
| 821 | 824 | 822 | 828 | 826 | 825 | 801-4 | 805 | 806 | 807 | 808 |
| 0 | 0 | 1 | 0 | 0 | 0 | 0000 | 0000 | 0000 | 0000 | 0000 |
| 1 | 0 | 1 | 0 | 0 | 0 | 0000 | 0000 | 0000 | 0000 | 0000 |
| 2 | 0 | 1 | 0 | 0 | 0 | 0000 | 0000 | 0000 | 0000 | 0000 |
| 3 | 1 | 0 | 0 | 0 | 0 | 0000 | 0000 | 0000 | 0000 | 0000 |
| 4 | 0 | 1 | 0 | 0 | 0 | 0000 | 0000 | 0000 | 0000 | 0000 |
| 5 | 0 | 1 | 0 | 0 | 0 | 0000 | 0000 | 0000 | 0000 | 0000 |
| 6 | 0 | 1 | 0 | 0 | 0 | 0000 | 0000 | 0000 | 0000 | 0000 |
| 7 | 1 | 0 | 0 | 1 | 1 | 0000 | 0001 | 1000 | 0000 | 0000 |
| 8 | 0 | 1 | 1 | 0 | 1 | 0000 | 0000 | 0100 | 0000 | 0000 |
| 9 | 0 | 1 | 1 | 0 | 0 | 0000 | 0000 | 0010 | 0000 | 0000 |
| 10 | 0 | 1 | 1 | 0 | 0 | 0000 | 0000 | 0001 | 0000 | 0000 |
| 11 | 1 | 0 | 1 | 0 | 0 | 0000 | 0100 | 0000 | 1000 | 0000 |
| 12 | 0 | 1 | 1 | 0 | 0 | 0000 | 0010 | 0000 | 0100 | 0000 |
| 13 | 0 | 1 | 1 | 0 | 0 | 0000 | 0001 | 0000 | 0010 | 0000 |
| 14 | 0 | 1 | 1 | 0 | 1 | 0000 | 0000 | 0000 | 0001 | 0000 |
| 15 | 1 | 0 | 1 | 0 | 0 | 0000 | 0001 | 0000 | 0000 | 1000 |
| 16 | 0 | 1 | 1 | 0 | 1 | 0000 | 0000 | 0000 | 0000 | 0100 |
| 17 | 0 | 1 | 1 | 0 | 0 | 0000 | 0000 | 0000 | 0000 | 0010 |
| 18 | 0 | 1 | 1 | 0 | 0 | 0000 | 0000 | 0000 | 0000 | 0001 |
| 19 | 1 | 0 | 1 | 0 | 0 | 0000 | 1000 | 0000 | 0000 | 0000 |
| 20 | 0 | 1 | 1 | 0 | 0 | 0000 | 0100 | 0000 | 0000 | 0000 |
| 21 | 0 | 1 | 1 | 0 | 0 | 0000 | 0010 | 0000 | 0000 | 0000 |
| 22 | 0 | 1 | 1 | 0 | 0 | 0000 | 0001 | 0000 | 0000 | 0000 |
| 23 | 1 | 0 | 1 | 0 | 1 | 0000 | 0000 | 0000 | 0000 | 0000 |

TABLE 3

| | | | | SIGNALS | | | | | | |
|---|---|---|---|---|---|---|---|---|---|---|
| 821 | 824 | 822 | 828 | 826 | 825 | 801-4 | 805 | 806 | 807 | 808 |
| 0 | 0 | 1 | 0 | 0 | 0 | 0000 | 0000 | 0000 | 0000 | 0000 |
| 1 | 0 | 1 | 0 | 0 | 0 | 0000 | 0000 | 0000 | 0000 | 0000 |
| 2 | 0 | 1 | 0 | 0 | 0 | 0000 | 0000 | 0000 | 0000 | 0000 |
| 3 | 1 | 0 | 0 | 0 | 0 | 0000 | 0000 | 0000 | 0000 | 0000 |
| 4 | 0 | 1 | 0 | 0 | 0 | 0000 | 0000 | 0000 | 0000 | 0000 |
| 5 | 0 | 1 | 0 | 0 | 0 | 0000 | 0000 | 0000 | 0000 | 0000 |
| 6 | 0 | 1 | 0 | 1 | 1 | 0001 | 0000 | 1000 | 0000 | 0000 |

TABLE 3-continued

| | | | | | | SIGNALS | | | | |
|---|---|---|---|---|---|---|---|---|---|---|
| 821 | 824 | 822 | 828 | 826 | 825 | 801-4 | 805 | 806 | 807 | 808 |
| 7 | 1 | 0 | 0 | 0 | 0 | 0000 | 1100 | 0100 | 0000 | 0000 |
| 8 | 0 | 1 | 1 | 0 | 0 | 0000 | 0110 | 0010 | 0000 | 0000 |
| 9 | 0 | 1 | 1 | 0 | 0 | 0000 | 0011 | 0001 | 0000 | 0000 |
| 10 | 0 | 1 | 1 | 0 | 1 | 0100 | 0001 | 0000 | 1000 | 0000 |
| 11 | 1 | 0 | 1 | 0 | 1 | 0000 | 0010 | 0000 | 0100 | 0000 |
| 12 | 0 | 1 | 1 | 0 | 0 | 0000 | 0001 | 0000 | 0010 | 0000 |
| 13 | 0 | 1 | 1 | 0 | 1 | 0000 | 0000 | 0000 | 0001 | 0000 |
| 14 | 0 | 1 | 1 | 0 | 0 | 0001 | 0000 | 0000 | 0000 | 1000 |
| 15 | 1 | 0 | 1 | 0 | 0 | 0000 | 1100 | 0000 | 0000 | 0100 |
| 16 | 0 | 1 | 1 | 0 | 0 | 0000 | 0110 | 0000 | 0000 | 0010 |
| 17 | 0 | 1 | 1 | 0 | 0 | 0000 | 0011 | 0000 | 0000 | 0001 |
| 18 | 0 | 1 | 1 | 0 | 1 | 1000 | 0001 | 0000 | 0000 | 0000 |
| 19 | 1 | 0 | 1 | 0 | 1 | 0000 | 0100 | 0000 | 0000 | 0000 |
| 20 | 0 | 1 | 1 | 0 | 0 | 0000 | 0010 | 0000 | 0000 | 0000 |
| 21 | 0 | 1 | 1 | 0 | 0 | 0000 | 0001 | 0000 | 0000 | 0000 |
| 22 | 0 | 1 | 1 | 0 | 1 | 0000 | 0000 | 0000 | 0000 | 0000 |
| 23 | 1 | 0 | 1 | 0 | 0 | 0000 | 0000 | 0000 | 0000 | 0000 |

TABLE 4

| | | | | | | SIGNALS | | | | |
|---|---|---|---|---|---|---|---|---|---|---|
| 821 | 824 | 822 | 828 | 826 | 825 | 801-4 | 805 | 806 | 807 | 808 |
| 0 | 0 | 1 | 0 | 1 | 1 | 0001 | 0000 | 1000 | 0000 | 0000 |
| 1 | 0 | 1 | 0 | 1 | 1 | 1101 | 0000 | 1100 | 0000 | 0000 |
| 2 | 0 | 1 | 0 | 0 | 0 | 1010 | 0000 | 0110 | 0000 | 0000 |
| 3 | 1 | 0 | 0 | 0 | 0 | 0000 | 0101 | 0011 | 0000 | 0000 |
| 4 | 0 | 1 | 0 | 1 | 1 | 0100 | 0010 | 0001 | 1000 | 0000 |
| 5 | 0 | 1 | 0 | 1 | 1 | 0111 | 0001 | 1000 | 1100 | 0000 |
| 6 | 0 | 1 | 0 | 0 | 0 | 1110 | 0000 | 1100 | 0110 | 0000 |
| 7 | 1 | 0 | 0 | 0 | 0 | 0000 | 0111 | 0110 | 0011 | 0000 |
| 8 | 0 | 1 | 0 | 1 | 1 | 0001 | 0011 | 0011 | 0001 | 1000 |
| 9 | 0 | 1 | 0 | 1 | 1 | 1001 | 0001 | 0001 | 1000 | 1100 |
| 10 | 0 | 1 | 0 | 0 | 0 | 1101 | 0000 | 1000 | 1100 | 0110 |
| 11 | 1 | 0 | 0 | 0 | 0 | 0000 | 1010 | 0100 | 0110 | 0011 |
| 12 | 0 | 1 | 0 | 1 | 1 | 1001 | 0101 | 1010 | 0011 | 0001 |
| 13 | 0 | 1 | 0 | 1 | 1 | 0001 | 0010 | 0101 | 0001 | 1000 |
| 14 | 0 | 1 | 0 | 0 | 0 | 1001 | 0001 | 0010 | 1000 | 1100 |
| 15 | 1 | 0 | 0 | 0 | 0 | 0000 | 1001 | 1001 | 0100 | 0110 |
| 16 | 0 | 1 | 0 | 1 | 1 | 0100 | 0100 | 0100 | 1010 | 0011 |
| 17 | 0 | 1 | 0 | 1 | 1 | 1011 | 0010 | 1010 | 0101 | 0001 |
| 18 | 0 | 1 | 0 | 0 | 0 | 0000 | 0001 | 0101 | 0010 | 1000 |
| 19 | 1 | 0 | 0 | 0 | 0 | 0000 | 0101 | 1010 | 1001 | 0100 |
| 20 | 0 | 1 | 0 | 1 | 1 | 0001 | 0010 | 0101 | 0100 | 1010 |
| 21 | 0 | 1 | 0 | 1 | 1 | 1001 | 0001 | 1010 | 1010 | 0101 |
| 22 | 0 | 1 | 0 | 0 | 0 | 0001 | 0000 | 1101 | 0101 | 0010 |
| 23 | 1 | 0 | 0 | 0 | 0 | 0000 | 1001 | 0110 | 1010 | 1001 |
| 24 | 0 | 1 | 0 | 1 | 1 | 1000 | 0100 | 0011 | 0101 | 0100 |
| 25 | 0 | 1 | 0 | 1 | 1 | 0000 | 0010 | 1001 | 1010 | 1010 |
| 26 | 0 | 1 | 0 | 0 | 0 | 0100 | 0001 | 0100 | 1101 | 0101 |
| 27 | 1 | 0 | 0 | 0 | 0 | 0000 | 1010 | 1010 | 0110 | 1010 |
| 28 | 0 | 1 | 0 | 1 | 1 | 0001 | 0101 | 1101 | 0011 | 0101 |
| 29 | 0 | 1 | 0 | 1 | 1 | 0001 | 0010 | 0110 | 1001 | 1010 |
| 30 | 0 | 1 | 0 | 0 | 0 | 1101 | 0001 | 0011 | 0100 | 1101 |
| 31 | 1 | 0 | 0 | 0 | 0 | 0000 | 0111 | 1001 | 1010 | 0110 |
| 32 | 0 | 1 | 0 | 1 | 1 | 0100 | 0011 | 0100 | 1101 | 0011 |
| 33 | 0 | 1 | 0 | 1 | 1 | 1011 | 0001 | 0010 | 0110 | 1001 |
| 34 | 0 | 1 | 0 | 0 | 0 | 0000 | 0000 | 1001 | 0011 | 0100 |
| 35 | 1 | 0 | 0 | 0 | 0 | 0000 | 0101 | 0100 | 1001 | 1010 |
| 36 | 0 | 1 | 0 | 1 | 1 | 0001 | 0010 | 0010 | 0100 | 1101 |
| 37 | 0 | 1 | 0 | 1 | 1 | 0101 | 0001 | 1001 | 0010 | 0110 |
| 38 | 0 | 1 | 0 | 0 | 0 | 1011 | 0000 | 1100 | 1001 | 0011 |
| 39 | 1 | 0 | 0 | 0 | 0 | 0000 | 0000 | 0110 | 0100 | 1001 |
| 40 | 0 | 1 | 0 | 1 | 1 | 1001 | 0000 | 1011 | 0010 | 0100 |
| 41 | 0 | 1 | 0 | 1 | 1 | 1101 | 0000 | 1101 | 1001 | 0010 |
| 42 | 0 | 1 | 0 | 0 | 0 | 1111 | 0000 | 0110 | 1100 | 1001 |
| 43 | 1 | 0 | 0 | 0 | 0 | 0000 | 0011 | 0011 | 0110 | 0100 |
| 44 | 0 | 1 | 1 | 0 | 1 | 0100 | 0001 | 0001 | 1011 | 0010 |
| 45 | 0 | 1 | 1 | 0 | 1 | 0111 | 0000 | 0000 | 1101 | 1001 |
| 46 | 0 | 1 | 1 | 0 | 0 | 0110 | 0000 | 0000 | 0110 | 1100 |
| 47 | 1 | 0 | 1 | 0 | 0 | 0000 | 0011 | 0000 | 0011 | 0110 |
| 48 | 0 | 1 | 1 | 0 | 1 | 0001 | 0001 | 0000 | 0001 | 1011 |
| 49 | 0 | 1 | 1 | 0 | 1 | 0101 | 0000 | 0000 | 0000 | 1101 |
| 50 | 0 | 1 | 1 | 0 | 0 | 0110 | 0000 | 0000 | 0000 | 0110 |
| 51 | 1 | 0 | 1 | 0 | 0 | 0000 | 0011 | 0000 | 0000 | 0011 |
| 52 | 0 | 1 | 1 | 0 | 1 | 1000 | 0001 | 0000 | 0000 | 0001 |
| 53 | 0 | 1 | 1 | 0 | 1 | 1100 | 0000 | 0000 | 0000 | 0000 |
| 54 | 0 | 1 | 1 | 0 | 0 | 0110 | 0000 | 0000 | 0000 | 0000 |
| 55 | 1 | 0 | 1 | 0 | 0 | 0000 | 0011 | 0000 | 0000 | 0000 |

TABLE 4-continued

| | | | | SIGNALS | | | | | | |
|---|---|---|---|---|---|---|---|---|---|---|
| 821 | 824 | 822 | 828 | 826 | 825 | 801-4 | 805 | 806 | 807 | 808 |
| 56 | 0 | 1 | 1 | 0 | 1 | 0000 | 0001 | 0000 | 0000 | 0000 |
| 57 | 0 | 1 | 1 | 0 | 1 | 0000 | 0000 | 0000 | 0000 | 0000 |
| 58 | 0 | 1 | 1 | 0 | 0 | 0000 | 0000 | 0000 | 0000 | 0000 |
| 59 | 1 | 0 | 1 | 0 | 0 | 0000 | 0000 | 0000 | 0000 | 0000 |

Figure 19:
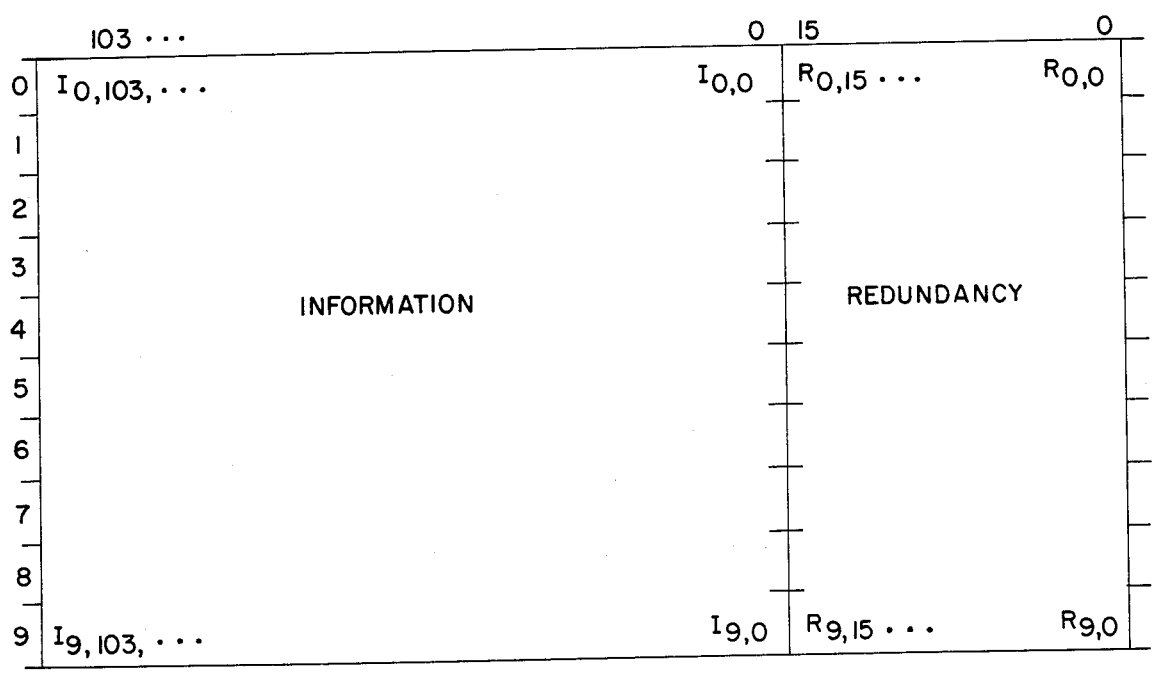
FIG. 19 shows the organization of data symbols and check symbols within an interleaved encoded data block.
Figure 20:
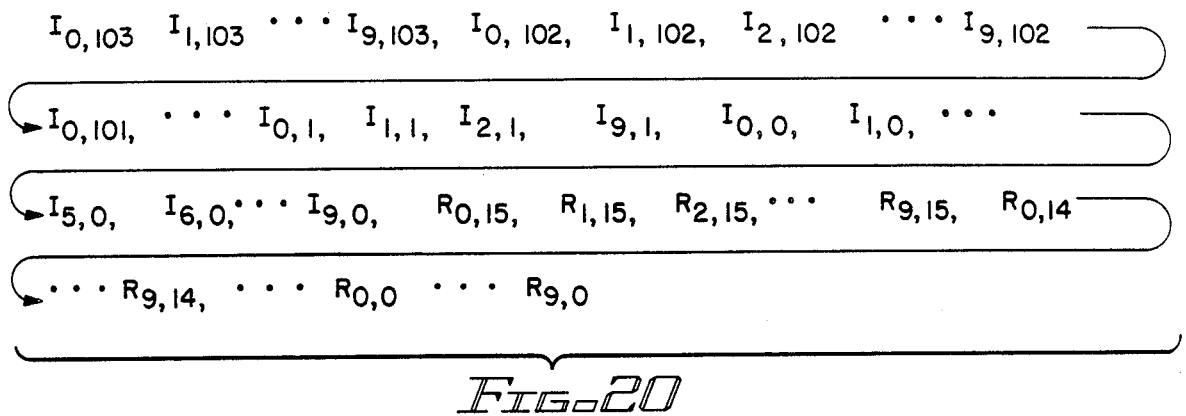
FIG. 20 shows the organization of data on a storage medium.

FIG. 19 and FIG. 20 show an example of an interleaved encoded data block. FIG. 19 shows conceptual organization and FIG. 20 shows how the format of the encoded data on the media relates to the conceptual organization. This example is of a 10-way interleaved, degree 16, distance 17 code over GF(256). For this example there are 1040 information bytes and 160 redundancy bytes in the interleaved encoded data block. The code generator polynomial is $$G(x) = \prod_{i=120}^{135} (x + a^i) =$$

$$x^{16} + 92x^{15} + 160x^{14} + 86x^{13} + 11x^{12} + 68x^{11} + 2x^{10} + x^9 +$$

$$167x^8 + x^7 + 2x^6 + 68x^5 + 11x^4 + 86x^3 + 160x^2 + 92x + 1$$

where $a^i = (\text{beta}^{88})^i$ and where $(\text{beta})^i$ are the elements of GF(256) whose representation are defined by the field generator polynomial $$x^8 + x^5 + x^3 + x^2 + 1$$

over GF(2).

In FIG. 19, the interleaved encoded data block is organized by rows and columns. Each row is an interleave or codeword. Data is transferred to or from the media one column at a time.

Referring to FIG. 19, generation of the redundancy polynomial R(x) for each interleave or codeword can be defined mathematically as follows:

$$R(x) = (x^{16}*I(x)) \text{ MOD } \prod_{i=120}^{135} (x + a^i)$$

I(x) is premultiplied by $x^{16}$ and then reduced modulo $$\prod_{i=120}^{135} (x + a^i)$$

The purpose of premultiplying by $x^{16}$ is to shift the information polynomial 16 places to the left to make room for the redundancy polynomial.

Referring to FIG. 20, $I_{0,103}$ is the GF(256) coefficient of the $x^{103}$ term of $I_0(x)$, the information polynomial for interleave (code word) zero. $I_{0,0}$ is the coefficient of the $x^0$ term of $I_0(x)$. $R_{0,15}$ is the coefficient of the $x^{15}$ term of $R_0(x)$, the redundancy polynomial for interleave zero.

Figure 21:
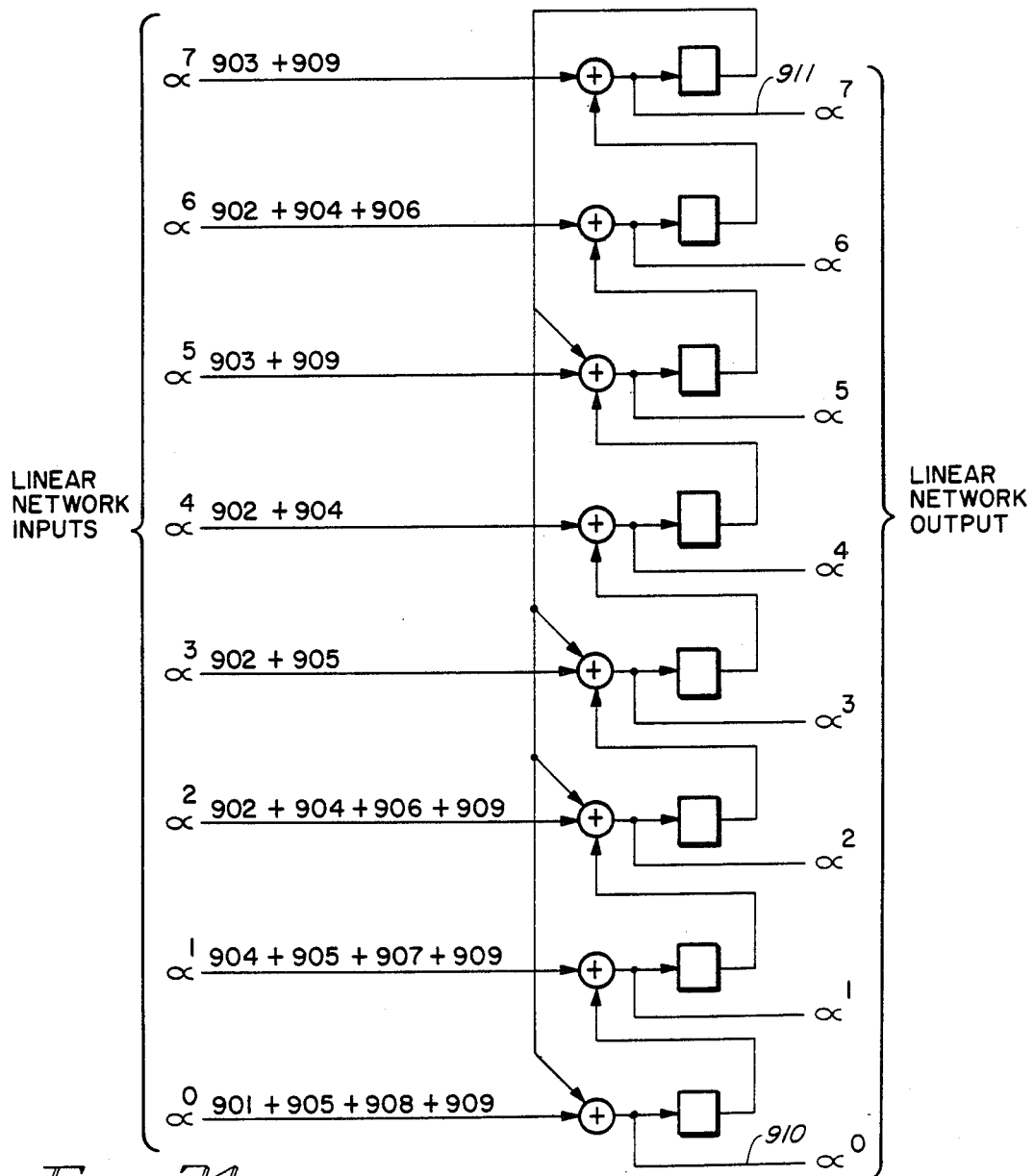
FIG. 21 shows the circuits that can be used to replace Network 900 of FIG. 17 so as to modify the implementation of the encoding and time domain syndrome generation.

The circuit of FIG. 17 can be modified to implement the encoding and time domain syndrome generation for the code of this example by replacing the linear network 900 of FIG. 17 with the circuits shown in FIG. 21, wherein like reference numbers refer to the same signal lines, and wherein registers 920, 921, 922, 923, 924, 924, 925, 926, 927, 928, 929, 930, 931, 931, 932, 933, 934, and 935 of FIG. 17 are each comprised of ten, eight-bit register elements and further wherein the parallel output of the linear network 900 is transferred to the leftmost register element of register 935.

What is claimed is:

1. Encoding and time domain syndrome generator apparatus for accepting from a data source a data block comprising data symbols comprising groups of binary bits, and creating from said data symbols check bits, derived from said data symbols in accord with a Reed-Solomon code, for output to an information channel, said encoding apparatus comprising:

(a) register set means for processing bits of said data block comprising
a first register,
a second register,
summing circuit means for performing modulo-two addition having a first input connected to said bits of said data block, a second input connected to said data source for receiving said output of said first register, and an output connected to said information channel and connected to an input of said second register,
a plurality of registers connected in series to an output of said second register;

(b) linear network means having one input connected to an input of said second register, one input connected to an output of said second register, and one input connected to an output of each of said plurality of registers for producing a modulo-two sum of finite field products of said inputs and the coefficients of a selected code generator polynomial;

(c) means for transferring parallel outputs of said linear network to said first register; and (d) synchronization means for controlling the assembly of a data symbol in said register set means, transferring said parallel outputs of said linear network means to said first register and controlling the propagation of information through said register set means.

2. The encoding and time domain syndrome generator apparatus as defined in claim 1 wherein each of said registers is comprised of a plurality of register elements for interleaving.

3. The encoding and time domain syndrome generator apparatus as defined in claim 1 wherein the coefficients of said selected code generator polynomial comprises a self reciprocal polynomial.

4. The encoding and time domain syndrome generator apparatus as defined in claim 1 wherein each of said registers is comprised of a serial shift register having m stages organized as one bit wide and m bits long wherein m is the number of bits in said data symbol.

5. The encoding and time domain syndrome generator apparatus as defined in claim 1 wherein each of said registers is comprised of a random access memory.

6. The encoding and time domain syndrome generator apparatus as defined in claim 1 wherein k bits of said data symbols are processed on each clock cycle wherein k evenly divides the number of bits in said data symbol.

7. The encoding and time domain syndrome generator apparatus as defined in claim 6 wherein said linear network means further comprises means for producing a sum of the output of bit n-q of a subset of said registers wherein $0<q<n$; and means for delaying said sum q clock cycles.

8. The encoding and time domain syndrome generator apparatus of claim 1 wherein said selected code generator polynomial is comprised of a GF(256) polynomial $$G(x) = \prod_{i=120}^{135}(x + \alpha^i) =$$
$$x^{16} + 92x^{15} + 160x^{14} + 86x^{13} + 11x^{12} + 68x^{11} + 2x^{10} + x^9 +$$
$$167x^8 + x^7 + 2x^6 + 68x^5 + 11x^4 + 86x^3 + 160x^2 + 92x + 1$$

where $\alpha^i = (\text{beta}^{88})^i$ and where $(\text{beta})^i$ are the elements of GF(256) whose representation are defined by the field generator polynomial $$x^8 + x^5 + x^3 + x^2 + 1$$

over GF(2).

* * * * *